US011781999B2

(12) United States Patent
Krokhmal (10) Patent No.: US 11,781,999 B2
(45) Date of Patent: Oct. 10, 2023

(54) SPOT-SIZE CONTROL IN REFLECTION-BASED AND SCATTEROMETRY-BASED X-RAY METROLOGY SYSTEMS

(71) Applicant: BRUKER TECHNOLOGIES LTD., Migdal HaEmek (IL)

(72) Inventor: Alexander Krokhmal, Haifa (IL)

(73) Assignee: BRUKER TECHNOLOGIES LTD., Migdal HaEmek (IL)

( * ) Notice: Subject to any disclaimer, the term of this patent is extended or adjusted under 35 U.S.C. 154(b) by 0 days.

(21) Appl. No.: 17/830,389

(22) Filed: Jun. 2, 2022

(65) Prior Publication Data

US 2023/0075421 A1 Mar. 9, 2023

Related U.S. Application Data

(60) Provisional application No. 63/240,920, filed on Sep. 5, 2021.

(51) Int. Cl.
*G01N 23/201* (2018.01)
*G01N 23/207* (2018.01)

(52) U.S. Cl.
CPC ......... *G01N 23/201* (2013.01); *G01N 23/207* (2013.01); *G01N 2223/045* (2013.01); *G01N 2223/6116* (2013.01)

(58) Field of Classification Search
CPC ............... G01N 23/201; G01N 23/207; G01N 2223/045; G01N 2223/6116;
(Continued)

(56) References Cited

U.S. PATENT DOCUMENTS 4,567,605 A  1/1986 Bartels
4,794,648 A  12/1988 Ayata et al.
(Continued)

FOREIGN PATENT DOCUMENTS

GB  974393 A  11/1964
JP  H3223656 A  10/1991
(Continued)

OTHER PUBLICATIONS

U.S. Appl. No. 17/505,696 Office Action dated Sep. 27, 2022.
(Continued)

*Primary Examiner* — David P Porta
*Assistant Examiner* — Mamadou Faye
(74) *Attorney, Agent, or Firm* — KLIGLER & ASSOCIATES PATENT ATTORNEYS LTD (57) ABSTRACT

An X-ray system includes, first and second X-ray channels (XCs), a spot sizer and a processor. The first XC is configured to: (i) direct a first X-ray beam for producing a spot on a surface of a sample, and (ii) produce a first signal responsively to a first X-ray radiation received from the surface. The spot sizer is positioned at a distance from the surface and is shaped and positioned to set the spot size by passing to the surface a portion of the first X-ray beam. The second XC is configured to: (i) direct a second X-ray beam to the surface, and (ii) produce a second signal responsively to a second X-ray radiation received from the surface, and the processor is configured to: (i) perform an analysis of the sample based on the first signal, and (ii) estimate the size of the spot based on the second signal.

20 Claims, 2 Drawing Sheets (58) Field of Classification Search
CPC ....... G01N 2223/052; G01N 2223/054; G01N 2223/34; H01L 22/12
See application file for complete search history.

(56) References Cited

U.S. PATENT DOCUMENTS

| | | | |
|---|---|---|---|
| 4,821,301 A | 4/1989 | Cocks et al. |
| 4,989,226 A | 1/1991 | Woodbury et al. |
| 5,016,267 A | 5/1991 | Wilkins |
| 5,199,058 A | 3/1993 | Tani et al. |
| 5,245,648 A | 9/1993 | Kinney et al. |
| 5,481,109 A | 1/1996 | Ninomiya et al. |
| 5,509,043 A | 4/1996 | Van Der Sluis |
| 5,619,548 A | 4/1997 | Koppel |
| 5,740,226 A | 4/1998 | Komiya et al. |
| 5,802,137 A | 9/1998 | Wilkins |
| 5,900,645 A | 5/1999 | Yamada |
| 5,937,026 A | 8/1999 | Satoh |
| 6,041,098 A | 3/2000 | Touryanski et al. |
| 6,108,398 A | 8/2000 | Mazor et al. |
| 6,163,592 A | 12/2000 | He et al. |
| 6,226,349 B1 | 5/2001 | Schuster et al. |
| 6,242,745 B1 | 6/2001 | Berlad et al. |
| 6,271,534 B1 | 8/2001 | Kumakhov |
| 6,381,303 B1 | 4/2002 | Vu et al. |
| 6,385,289 B1 | 5/2002 | Kikuchi |
| 6,389,102 B2 | 5/2002 | Mazor et al. |
| 6,421,414 B1 | 7/2002 | Huber |
| 6,512,814 B2 | 1/2003 | Yokhin et al. |
| 6,556,652 B1 | 4/2003 | Mazor et al. |
| 6,574,306 B2 | 6/2003 | Kikuchi |
| 6,639,968 B2 | 10/2003 | Yokhin et al. |
| 6,665,372 B2 | 12/2003 | Bahr et al. |
| 6,680,996 B2 | 1/2004 | Yokhin et al. |
| 6,750,952 B2 | 6/2004 | Grodnensky et al. |
| 6,754,304 B1 | 6/2004 | Kumakhuv |
| 6,754,305 B1 | 6/2004 | Rosencwaig et al. |
| 6,782,076 B2 | 8/2004 | Bowen et al. |
| 6,810,105 B2 | 10/2004 | Nasser-Ghodsi et al. |
| 6,859,520 B2 | 2/2005 | He et al. |
| 6,879,051 B1 | 4/2005 | Singh et al. |
| 6,895,075 B2 | 5/2005 | Yokhin et al. |
| 7,035,373 B2 | 4/2006 | Omote |
| 7,068,753 B2 | 6/2006 | Berman et al. |
| 7,076,024 B2 | 7/2006 | Yokhin |
| 7,110,491 B2 | 9/2006 | Mazor et al. |
| 7,113,566 B1 | 9/2006 | Peled et al. |
| 7,120,228 B2 | 10/2006 | Yokhin et al. |
| 7,242,745 B2 | 7/2007 | He et al. |
| 7,257,192 B2 | 8/2007 | Omote |
| 7,406,153 B2 | 7/2008 | Berman |
| 7,453,985 B2 | 11/2008 | Mazor et al. |
| 7,481,579 B2 | 1/2009 | Yokhin et al. |
| 7,483,513 B2 | 1/2009 | Mazor et al. |
| 7,542,548 B2 | 6/2009 | Matsuo et al. |
| 7,551,719 B2 | 6/2009 | Yokhin et al. |
| 7,600,916 B2 | 10/2009 | Yokhin et al. |
| 7,646,849 B2 | 1/2010 | Iwasaki et al. |
| 7,653,174 B2 | 1/2010 | Mazor et al. |
| 7,684,543 B2 | 3/2010 | Matsuo et al. |
| 7,711,091 B2 | 5/2010 | Sasaki et al. |
| 7,801,272 B2 | 9/2010 | Toraya |
| 7,817,779 B2 | 10/2010 | Ando |
| 8,085,900 B2 | 12/2011 | Omote |
| 8,243,878 B2 | 8/2012 | Yokhin et al. |
| 8,249,220 B2 | 8/2012 | Verman et al. |
| 8,340,248 B2 | 12/2012 | Toraya et al. |
| 8,422,633 B2 | 4/2013 | Lantz et al. |
| 8,437,450 B2 | 5/2013 | Wall et al. |
| 8,687,766 B2 | 4/2014 | Wormington et al. |
| 9,269,468 B2 | 2/2016 | Ryan et al. |
| 9,335,282 B2 | 5/2016 | Omote et al. |
| 9,606,073 B2 | 3/2017 | Mazor et al. |
| 9,632,043 B2 | 4/2017 | Mazor et al. |
| 9,778,213 B2 | 10/2017 | Bakeman et al. |
| 10,352,695 B2 | 7/2019 | Dziura et al. |
| 10,386,313 B2 | 8/2019 | Mazor et al. |
| 10,816,487 B2 | 10/2020 | Matney et al. |
| 11,181,490 B2 | 11/2021 | Dikopoltsev et al. |
| 2001/0043668 A1 | 11/2001 | Hayashi et al. |
| 2003/0128809 A1 | 7/2003 | Umezawa et al. |
| 2004/0032581 A1 | 2/2004 | Nikoonahad et al. |
| 2004/0156474 A1 | 8/2004 | Yokhin et al. |
| 2006/0284081 A1 | 12/2006 | Miyamoto et al. |
| 2006/0288325 A1 | 12/2006 | Miyamoto et al. |
| 2006/0289790 A1 | 12/2006 | Raymond et al. |
| 2007/0290703 A1 | 12/2007 | Hollman |
| 2008/0239318 A1 | 10/2008 | Den Boef et al. |
| 2009/0095913 A1 | 4/2009 | Yu et al. |
| 2011/0210250 A1 | 9/2011 | Nakayama et al. |
| 2011/0268251 A1 | 11/2011 | He |
| 2014/0019097 A1 | 1/2014 | Bakeman et al. |
| 2014/0151569 A1 | 6/2014 | Schnablegger et al. |
| 2015/0241469 A1 | 8/2015 | Osborne et al. |
| 2015/0300965 A1 | 10/2015 | Sezginer et al. |
| 2015/0369759 A1 | 12/2015 | Mazor et al. |
| 2017/0199136 A1 | 7/2017 | Krokhmal et al. |
| 2017/0227478 A1 | 8/2017 | Grimshaw et al. |
| 2017/0259085 A1 | 9/2017 | Bennett et al. |
| 2017/0307548 A1 | 10/2017 | Bykanov et al. |
| 2018/0106735 A1 | 4/2018 | Gellineau et al. |
| 2019/0049602 A1 | 2/2019 | Hench et al. |
| 2019/0310080 A1 | 10/2019 | Hill et al. |
| 2019/0323974 A1 | 10/2019 | Wormington et al. |
| 2019/0323975 A1 | 10/2019 | Wormington et al. |
| 2019/0323976 A1 | 10/2019 | Vinshtein et al. |
| 2020/0319443 A1 | 10/2020 | Liu et al. |
| 2021/0285898 A1* | 9/2021 | Dikopoltsev .......... G01B 15/00 |
| 2022/0042933 A1 | 2/2022 | Dikopoltsev et al. |

FOREIGN PATENT DOCUMENTS

| | | |
|---|---|---|
| JP | 9054050 A | 2/1997 |
| JP | H0949811 A | 2/1997 |
| JP | H0954050 A | 2/1997 |
| JP | 2006250938 A | 9/2006 |
| JP | 2008258606 A | 10/2008 |
| JP | 2014109579 A | 6/2014 |
| TW | 201546444 A | 12/2015 |
| TW | 201704728 A | 2/2017 |
| TW | 201802245 A | 1/2018 |
| WO | 2013052318 A1 | 4/2013 |

OTHER PUBLICATIONS

TW Application # 108113313 Office Action dated Nov. 16, 2022.
"Fast SDD Ultra High Performance Silicon Drift Detector," Product Information, Amptek, Inc., pp. 1-4, year 2019, as downloaded from https://www.amptek.com/products/x-ray-detectors/fastsdd-x-ray-detectors-for-xrf-eds/fastsdd-silicon-drift-detector.
"Fast, Accurate and Precise Quantification Results Using an Annular Silicon Drift Detector: Bruker's XFlash FlatQUAD," Product Information, Bruker, pp. 1-6, year 2022, as downloaded from https://www.bruker.com/en/news-and-events/webinars/2020/fast-accurate-and-precise-quantification-results-using-an-annular-silicon-drift-detector%e2%80%a6.html.
"Silicon Drift Detectors," Product Information, Ketek GmbH, pp. 1-4, year 2021, as downloaded from https://www.ketek.net/sdd/?gclid=EAlalQobChMlkNbPqKSJ-AIVjeJ3Ch0M_gFwEAAYASAAEgliJfD_BwE.
Krokhmal et al., U.S. Appl. No. 17/709,451, filed Mar. 31, 2022.
TW Application # 108113315 Office Action dated Jul. 25, 2022.
TW Applicaton # 108113314 Office Action dated Aug. 5, 2022.
KR Application # 1020190044142 Office Action dated Mar. 6, 2023.
JP Application # 2020573226 Office Action dated Jan. 18, 2023.
Jones et al., "Small angle x-ray scattering for sub-100 nm pattern characterization", Applied Physics Letters, vol. 83, No. 19, pp. 4059-4061, Nov. 10, 2003.
Jones et al., "3-Dimensional Lineshape Metrology Using Small Angle X-ray Scattering", AIP Conference Proceedings, vol. 683, Issue 1, pp. 1-4, Sep. 2003.

(56) References Cited

OTHER PUBLICATIONS

Wormington et al., "Characterization of structures from X-ray scattering data using genetic algorithms", The Royal Society, Philosophical Transactions: Mathematical, Physical and Engineering Sciences, vol. 357, No. 1761, X-Ray Topography and Crystal Characterization, pp. 2827-2848, Oct. 15, 1999.
AXO Dresden GmbH, "Applied X-ray Optics and High Precision Deposition", Technical Data Sheet, pp. 1-23, May 22, 2013.
Dectris Ltd.,—detecting the future, Eiger X, Detector Series, "The Summit of Hybrid Photon Counting", pp. 1-4, Sep. 9, 2015.
Oxford Instruments., "50kV Microfocus X-ray source", Technical Data Sheet, pp. 1-2, May 19, 2015.
Xenocs., "X-ray eam delivery system", Technical Data Sheet, pp. 1-4, Sep. 15, 2009.
XOS., "Polycapillary Optics for Micro X-Ray Fluorescence and X-Ray Diffraction", pp. 1-4, Jul. 23, 2015.
Jones et al., "Subnanometer wavelength metrology of lithographically prepraed structures: a comparison of neutron and X-ray scattering", Proceedings of the SPIE, vol. 5038, pp. 191-199, year 2003.
Wiener et al., "Characterization of Titanium Nitride Layers by Grazing-Emission X-Ray Fluorescence Spectrometry", Applied Surface Science, vol. 125, pp. 129-136, Elsevier Science B.V., year 1999.
Oxford Instruments Inc., X-ray Tube Information, Series 5000, Model XTF5011, "Packaged X-Ray tubes", Technical Data Sheet, pp. 1-3, Jun. 1998.
Hayashi et al., "Refracted X-Rays Propagating Near the Surface Under Grazing Incidence Condition", Spectrochimica Acta, Part B 54, pp. 227-230, year 1999.
X-Ray Optical Systems, Inc., "Monolithic Polycapillary Lens Information", Albany, USA, pp. 1-1, Dec. 29, 1998.
Di-Fonzo et al., "Non-Destructive Determination of Local Strain with 100-Nanometre Spatial Resolution", Letters to Nature, vol. 403, pp. 638-640, Feb. 10, 2000.
Guerault, "Specular Reflectivity and Off-Specular Scattering: Tools for Roughness Investigation", Institute Voor Kern-en Stralingsfysica, pp. 1-15, Dec. 15, 2000.
Hu et al., "Small Angle X-Ray Scattering Metrology for Sidewall Angle and Cross Section of Nanometer Scale Line Gratings", Journal of Applied Physics, vol. 96, No. 4, pp. 1983-1987, Aug. 15, 2004.
Wu et al., "Small Angle Neutron Scattering Measurements of Nanoscale Lithographic Features", Polymer Preprints, vol. 42, No. 1, pp. 265-266, year 2001.
Kojima et al., "Structural Characterization of Thin Films by X-Ray Reflectivity", Rigaku Journal, vol. 16, No. 2, pp. 31-41, year 1999.
Jordan Valley Semiconductors Ltd., "D1 Evolution System", pp. 1-2, Israel, year 2013.
Crystal Scientific, "Channel Cut Crystals", UK, pp. 1-1, year 2011.
AXO Dresden GMBH, "Multilayer mirrors—potentials for imaging, monochromating, collimating or focusing optics", ACTOP 11, Oxford, UK, Apr. 4-5, pp. 1-30, year 2011.
Bartels., "Characterization of thin layers on perfect crystals with a multipurpose high resolution x-ray diffractometer", Journal of Vacuum Science and Technology B1, vol. 1, issue 2, pp. 338-345, Apr. 1983.
Loxley et al., "The Performance of Channel Cut Collimators for Precision X-Ray Diffraction Studies of Epitaxial Layers", MRS Proceedings, vol. 208, pp. 107-112, year 1990.
Schuster et al., "Parallel-beam coupling into channel-cut monochromators using curved graded multilayers," Journal of Physics D: Applied Physics 28 , A270-A275, pp. 1-7, year 1995.
Incoatec GmbH., "Montel Optics—2D Multilayer Mirrors for X-ray Diffractometry", pp. 1-2, year 2015.
Incoatec, "The IµS-Story—10 Years Incoatec Microfocus Source", pp. 1-4, year 2016.
Excillum., MetalJet X-Ray Sources, pp. 1-2, year 2018.
Bruker AXS GmbH, "X-Ray source—Microstar", pp. 1-2, Mar. 2018.
Piezomotor., "Linear Motors", pp. 1-5, year 2017.
Lyncean Technologies, Inc, "The Compact X-Ray Station (CXS)", pp. 1-5, year 2017.
Bowen et al., "High resolution x-ray diffractometry and topography", pp. 1-278, Taylor & Francis Publication, year 1998.
Chadwick et al., "Radiolucent Structural Materials for Medical Applications", MDDI online, pp. 1-14, Jun. 1, 2001 downloaded from https://www.mddionline.com/news/radiolucent-structural-materials-medical-applications.
Paris et al., "A new experimental station for simultaneous X-ray microbeam scanning for small- and wide-angle scattering and fluorescence at BESSY II", Journal of Applied Crystallography, vol. 40, pp. s466-s470, year 2007.

\* cited by examiner

FIG. 1

SPOT-SIZE CONTROL IN REFLECTION-BASED AND SCATTEROMETRY-BASED X-RAY METROLOGY SYSTEMS

CROSS-REFERENCE TO RELATED APPLICATIONS

This application claims the benefit of U.S. Provisional Patent Application 63/240,920, filed Sep. 5, 2021, whose disclosure is incorporated herein by reference.

FIELD OF THE INVENTION

The present invention relates generally to X-ray analysis, and particularly to methods and systems for improving spot-size control in reflection-based and scatterometry-based X-ray metrology systems.

BACKGROUND OF THE INVENTION

Various techniques for controlling the spot size of X-ray beams in semiconductor manufacturing processes have been published.

SUMMARY OF THE INVENTION

An embodiment of the present invention that is described herein provides an X-ray system including first and second X-ray channels (XCs), a spot sizer and a processor. The first XC is configured to: (i) direct a first X-ray beam for producing a spot on a surface of a sample, and (ii) produce a first signal responsively to a first X-ray radiation received from the surface. The spot sizer is positioned at a distance from the surface and is shaped and positioned to set a size of the spot by passing to the surface a portion of the first X-ray beam, the second XC is configured to: (i) direct a second X-ray beam to the surface, and (ii) produce a second signal responsively to a second X-ray radiation received from the surface, and the processor is configured to: (i) perform an analysis of the sample based on the first signal, and (ii) estimate the size of the spot based on the second signal.

In some embodiments, the X-ray system includes a motion assembly, which is configured to adjust the distance between the spot sizer and the surface, and the processor is configured to adjust the spot size by controlling the motion assembly based on the second signal. In other embodiments, the X-ray system includes a beam shaper, which is positioned along a path of at least the first X-ray beam, and is configured to pass a selected angular sector of the first X-ray beam. In yet other embodiments, the first X-ray beam is directed at a first angle relative to the surface, and the second X-ray beam is directed, relative to the surface, at a second angle different from the first angle.

In some embodiments, the sample includes a semiconductor wafer having the surface on a first side, and a second side. The first and second XCs include: (i) first and second X-ray sources configured to direct the first and second X-ray beams, respectively, and (ii) first and second X-ray detectors configured to sense the first and second X-ray radiations, respectively, and the first and second X-ray sources and the first and second X-ray detectors are positioned on the first side of the wafer. In other embodiments, the first and second XCs are positioned so that a projection of the first X-ray beam on the surface lies along a first axis, and a projection of the second X-ray beam on the surface lies along a second axis, different from the first axis. In yet other embodiments, a surface of the spot sizer has a roughness smaller than 1 µm.

In some embodiments, the spot sizer has a spherical shape or a spheroidal shape. In other embodiments, the spot sizer includes at least one of: (i) tungsten, (ii) tungsten carbide, (iii) tantalum, (iv) gold, (v) platinum, and (vi) rhenium. In yet other embodiments, based on the first signal, the processor is configured to perform at least one of: (i) X-ray reflectivity (XRR), and (ii) grazing-incidence small-angle X-ray scattering (GI-SAXS), measurements on one or more structures formed on the surface.

There is additionally provided, in accordance with an embodiment of the present invention, a method including directing a first X-ray beam for producing a spot on a surface of a sample, and producing a first signal responsively to a first X-ray radiation received from the surface. A spot sizer shaped and positioned for setting a size of the spot by passing to the surface a portion of the first X-ray beam, is positioned at a distance from the surface. A second X-ray beam is directed to the surface, and a second signal is produced responsively to a second X-ray radiation received from the surface. An analysis of the sample is performed based on the first signal, and the size of the spot is estimated based on the second signal.

The present invention will be more fully understood from the following detailed description of the embodiments thereof, taken together with the drawings in which:

DETAILED DESCRIPTION OF EMBODIMENTS

Overview

Production of integrated circuits (IC) typically comprises measurements, such as X-ray measurements, of structures within the IC devices to ensure the fabricated structures meet the design requirements. The reduced dimensions of the structures in the IC devices reduces the spot size of the X-ray beam, which is required to enable suitable measurements of the structures in question. More specifically, maintaining a spot dimeter smaller than about 500 µm is challenging in reflection-based configurations, such as in X-ray reflectivity (XRR) metrology systems and in grazing-incidence small-angle X-ray scattering (GI-SAXS) metrology systems.

Embodiments of the present invention that are described hereinafter provide techniques for improving the spot-size control in systems for X-ray measurement, such as but not limited to XRR and GI-SAXS systems, while analyzing structures of the IC. In the context of the present disclosure and in the claims, the term "X-ray analysis" and grammatical variations thereof, refers to various types of measurements carried out, for example, on a substrate of the IC and on structures of the IC produced on the surface of the substrate.

In some embodiments, an X-ray metrology system (also referred to herein as an "X-ray system" or "system," for brevity) comprises two X-ray channels (XC), referred to herein as first and second XCs. The term imaging refers to acquisition and processing of signals for performing analysis on a sample as will be described below. Each XC comprises an X-ray source, which may include X-ray optical elements such as mirrors, crystals, and slits, and is configured to condition and direct an X-ray beam to a measurement site for producing a spot on the surface of the sample. In the present example, the sample comprises a semiconductor (e.g., silicon or any suitable compound semiconductor) wafer having transistors (and optionally memory cells and other structures) and metal interconnects formed on the surface of an active side of the wafer. Note that the measurements are carried out at different steps of the process flow, and the one or more outer layers and/or structures are analyzed using the X-ray system.

In some embodiments, each XC further comprises a measurement assembly, such as an X-ray detector assembly (XDA), which is configured to sense photons radiated from the semiconductor wafer responsively to the directed X-ray beam. In the context of the present disclosure and in the claims, the term "radiation" and grammatical variations thereof, refers to one or more X-ray photons that, in response to directing the X-ray beam, are reflected, scattered or emitted from the wafer in any other physical mechanism, including fluorescence spectroscopy emitted responsively to the directed X-ray beam.

In such embodiments, the first XC directs a first X-ray beam to the surface and based on the X-ray radiations received from the surface responsively, the first XC is configured to produce a first signal indicative of properties of the structures intended to be analyzed. The term "properties" refers to one or more: (i) mechanical dimensions, such as but not limited to thickness of a layer, width of a line, a trench, a hole, a space between adjacent lines, and depth/height thereof, (ii) material structure, such as chemical elements, and stoichiometry and solid-state structure (e.g., phase) thereof, (iii) various types of defects, such as void and dislocations in the crystal structure, and any other properties of interest.

In some embodiments, the X-ray system comprises a spot sizer, also referred to herein as a "knife", which is positioned at a suitable distance from the surface and is shaped and positioned to set the size of the spot by passing to the surface a portion of the first X-ray beam. In the context of the present disclosure, the term "set the spot size" and grammatical variations thereof refer to setting one or more physical dimension of the spot. More specifically, in an embodiment, the knife (also refers to herein as a spot size) is configured to set a limitation to the length of the spot whereas the width of the spot may not be affected by the knife. The X-ray system comprises a motion assembly having a chuck for gripping the wafer, and a stage configured to move the wafer along at least one of: X-, Y- and Z-axes, and/or to rotate the wafer about the Z-axis, and/or to tilt the wafer relative to the XY plane. The motion assembly is configured to adjust the distance between the spot sizer and the wafer surface, e.g., by moving the wafer relative to the spot sizer along the Z-axis. Additionally, or alternatively, the X-ray system comprises an additional motion assembly configured to move the knife relative to the surface of the wafer.

In some embodiments, the second XC is configured to: (i) direct the respective X-ray beam (also referred to herein as a second X-ray beam) to the surface, and (ii) produce a second signal responsively to the respective (also referred to herein as a second) X-ray radiation received from the surface.

In some embodiments, the X-ray system comprises a processor, which is configured to control the XCs, motion assembly and other modules of the system, and to receive the first and second signals described above. The processor is configured to: (i) perform the sample analysis at the one or more measurement sites based on the first signal, and (ii) estimate the size of the spot based on the second signal.

The spot size and the intensity of the radiated X-ray depend, inter alia, on the incident angle of the directed X-ray beam. In a GI-SAXS system without a knife, for example, in incidence angles smaller than about 0.23°, the intensity sensed by an X-ray detector is on the order of a few millions of photons per second, and in incidence angles between about 0.25° and 3°, the intensity sensed by an X-ray detector is on the order of a few thousands of photons per second, i.e., about three orders of magnitude less. Moreover, the spot size is substantially smaller when using incidence angles between about 0.25° and 3°.

Lower intensity may be compensated, e.g., by increasing the measurement time and/or the intensity of the incident angle. Smaller spot size, however, must be obtained to carry out the measurements properly. In some GI-SAXS configurations, in order to obtain the required spot size, the distance between the knife and wafer surface must be on the order of about 1 μm, so that any undesired vibration or thermal expansion of related parts of the system may cause distance variations that may result in spot size non-uniformity over time, and in severe cases, a collision between the knife and wafer surface.

In some embodiments, based on the intensity of the X-rays received in the second signal, the processor is configured to estimate the distance between the knife and wafer surface, and therefore, to estimate the spot size (as will be illustrated and described in detail in FIGS. 1 and 2 below). Based on the second signal, the processor is further configured to adjust the spot size by controlling the motion assembly to adjust the distance between the knife and the wafer surface.

In some embodiments, in addition to controlling the distance between the knife and wafer surface, the processor is configured to control the first and second XCs to direct the first X-ray beam at a larger angle compared that of the second X-ray beam. In such embodiments, the spot size of the first X-ray beam is sufficiently small (e.g., smaller than about 500 μm), and the increased signal to noise ratio (SNR) of the second signal improves the monitoring sensitivity of the distance between the knife and the wafer surface.

In some embodiments, the wafer has an active side (also referred to herein as a first side) that includes the surface and active components, and a passive side, also referred to herein as a second side (e.g., backside) of the wafer. In the present example, both XCs are positioned at the first side of the wafer. Moreover, the first and second XCs are positioned so that a projection of the first X-ray beam on the wafer surface lies along a first axis, and a projection of the second X-ray beam on the wafer surface lies along a second axis, different from the first axis. In other words, as shown in FIG. 2 below, there is an angle between the projections of the first and second X-ray beams on the wafer surface. This configuration separates between the first and second X-ray radiations received from the wafer surface, and improved the SNR of both the first and second signals.

In some embodiments, the spot sizer has a spherical or spheroidal shape (e.g., a ball) to obtain the same SNR when the first and second axes lie at any angle parallel to the surface of the wafer, and also, relative to one another. Moreover, the spot sizer ball comprises X-ray attenuating materials, such as but not limited to: (i) tungsten, (ii) tungsten carbide, (iii) tantalum, and any suitable combination thereof.

The disclosed techniques improve the quality of X-ray analysis carried out using XRR and GI-SAXS systems and other systems having the X-ray source and detectors positioned at the same side of the wafer.

System Description

Figure 1:
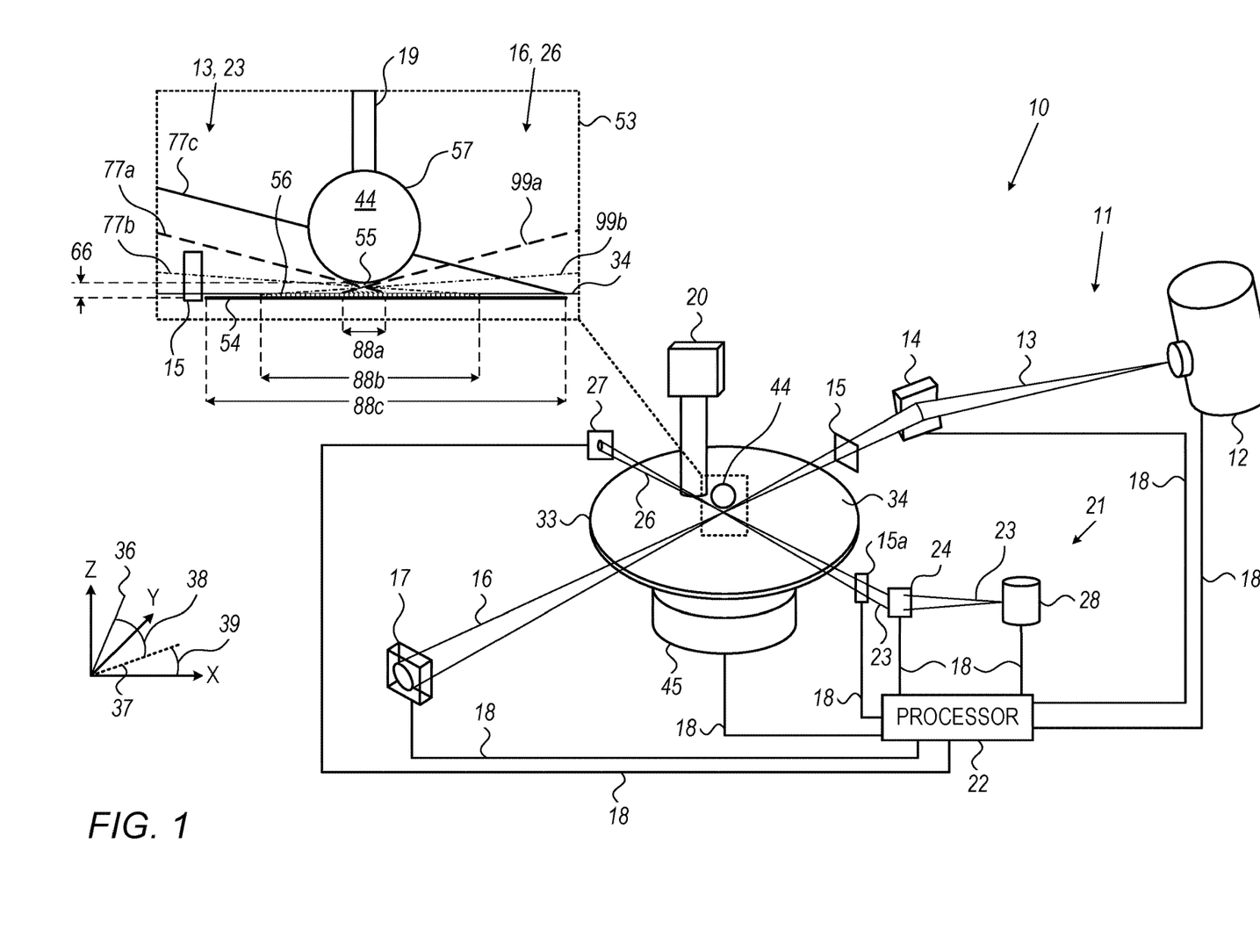
FIG. 1 is a schematic, pictorial illustration of a system for X-ray measurements having two X-ray channels, in accordance with an embodiment of the present invention.

FIG. 1 is a schematic, pictorial illustration of an X-ray metrology system 10, in accordance with an embodiment of the present invention. In the present example, X-ray metrology system 10, which is also referred to herein as system 10 (for brevity), comprises an X-ray reflectivity (XRR) metrology system, or a grazing-incidence small-angle X-ray scattering (GI-SAXS) metrology system described in detail, for example, in U.S. Pat. Nos. 6,512,814, 6,639,968, 6,895,075, 7,551,719, 7,483,513, 7,068,753, 7,406,153, 7,453,985, and 10,386,313, whose disclosures are all incorporated herein by reference.

In some embodiments, system 10 comprises an X-ray channel (XC) 11 and an XC 21 having typically similar features with optionally some differences therebetween. Therefore, the description below is related to parts and components of XC 11, but is also applicable to XC 21, mutatis mutandis. Some of the differences may comprise, for example, (i) differences in the X-ray sources (described herein) of XCs 11 and 21, e.g., having different materials in their respective anodes, and (ii) differences in the X-ray optics for adjusting the illumination conditions of the respective X-ray beams, as will be described below.

In some embodiments, XC 11 comprises an X-ray source 12, in the present example, an X-ray tube, driven by a high-voltage power supply unit (not shown). The X-ray tube is configured to emit an X-ray beam 13 having a suitable energy range and flux into X-ray optics 14, which are aligned with X-ray source 12 in the XYZ coordinate system of system 10. X-ray optics 14 are configured such that the X-ray beam 13 illuminates a small region, referred to herein as a measurement position or measurement site, e.g., a spot having a diameter typically smaller than about 100 μm (but can also have its largest dimension smaller than about 500 μm), on the surface of a sample.

In the present example, the sample comprises a semiconductor wafer, referred to herein as a wafer 33, having an active side (also referred to herein as a first side) having active and passive components of an integrated circuit (IC), such as transistors and memory cells, formed on a surface 34 of wafer 33 and also into the wafer and in multiple layers patterned over surface 34. Note that ICs typically comprise tens of layers patterned within wafer 33 and over surface 34 using hundreds of very large-scale integration (VLSI) processes known in the art. In the present example, system 10 is configured to carry out X-ray analysis (e.g., measurements) operations during the fabrication steps of the ICs, and therefore, the term surface 34 refers to the outer surface of the active side of wafer 33 during the respective X-ray analysis operation. Note that wafer 33 lies in an XY plane of the XYZ coordinate system, and XC 11 is configured to direct beam 13 at an incident angle, referred to herein as an elevation angle 38, which is an elevation angle relative to the XY plane, as shown in the illustrated coordinate system of FIG. 1. The coordinate system also shows a rotation angle 39, indicative of an azimuth of a projection 37 of a vector 36 in the XY plane.

In the context of the present disclosure and in the claims, the terms "about" or "approximately" for any numerical values or ranges indicate a suitable dimensional tolerance that allows the part or collection of components to function for its intended purpose as described herein.

In some embodiments, system 10 comprises a beam shaper 15, which is configured to control the shape of beam 13 in accordance with the X-ray analysis application intended to be carried out using system 10. System 10 further comprises an integrated optical inspection system, in the present example, an optical microscope (OM) 20 configured to produce one or more optical images of the surface of wafer 33 at the measurement site. OM 20 is further configured to assist in the positioning of the intended measurement site for performing the X-ray analysis.

In some embodiments, system 10 comprises an X-ray detector assembly (XDA) 17, which comprises one or more suitable types of X-ray detectors configured to sense photons of X-ray radiation (XR) 16 radiated from wafer 33 responsively to the physical interaction between wafer 33 and directed X-ray beam 13.

Similarly, XC 21 comprises an X-ray source 28, X-ray optics 24 and a beam shaper 15a that correspond to X-ray source 12, X-ray optics 14 and beam shaper 15 of XC 11, respectively.

In some embodiments, X-ray source 28 is configured to emit an X-ray beam 23 having a suitable energy range and flux into X-ray optics 24, which is aligned with X-ray source 28 in the XYZ coordinate system of system 10. XC 21 further comprises an XDA 27, which comprises one of or more suitable types of X-ray detectors (typically similar to that of XDA 17 of XC 11) configured to sense photons of X-ray radiation (XR) 26 radiated from wafer 33 responsively to the physical interaction between wafer 33 and directed X-ray beam 23.

In some embodiments, system 10 comprises a processor 22, which is configured to control the XCs and other modules and parts of system 10, as will be described in detail hereinafter.

Reference is now made to an inset 53. In some embodiments, system 10 comprises a spot sizer, also referred to herein as a knife 44, which is positioned at a suitable distance 66 from surface 34 of wafer 33, and is shaped and positioned to set a spot size 88a of beam 13 on surface 34, by passing to surface a portion of X-ray beam 13. In the context of the present disclosure, the term "set the spot size" and grammatical variations thereof refer to setting one or more physical dimension of the spot (e.g., spot 88a). More specifically, in an embodiment, knife 44 is configured to set a limitation to the size of the spot along a longitudinal axis of the respective beam, whereas the size of the spot along a different axis (e.g., an axis orthogonal to the longitudinal axis of the respective beam) may not be affected by knife 44.

In some examples, knife 44 has a symmetric cross section in a plane parallel to surface 34 of wafer 33. In the example of inset 53, knife 44 has a spherical shape or a spheroidal shape (e.g., a ball) comprising any suitable type of X-ray attenuating materials, such as but not limited to: (i) tungsten, (ii) tungsten carbide, (iii) tantalum, (iv) heavy metals, such as but not limited to gold, platinum and rhenium, and any suitable combination thereof. Knife 44 is coupled to system 10 using a suitable arm 19 or any other suitable type of mechanical connection assembly.

Reference is now made back to the general view of FIG. 1. In some embodiments, system 10 comprises a motion assembly 45, in the present example a chuck (not shown) for gripping wafer 33 and a movable stage, which is controlled by processor 22 and is configured to move wafer 33 along the X- and Y-axes of the XY plane. Additionally, or alternatively, the stage is further configured to move wafer 33 along the Z-axis, to rotate wafer 33 about the Z-axis in any suitable rotation angle 39, and to tilt wafer 33 relative to the XY plane in any suitable elevation angle 38. Additionally, or alternatively, system 10 comprises an additional motion assembly (not shown) configured to move knife 44 relative to surface 34 of wafer 33 for adjusting distance 66 between the surface of knife 44 and surface 34 of wafer 33.

Reference is now made back to inset 53. In some embodiments, when directed toward wafer 33, beam 13 has multiple angular sectors (ASs) 77, such as AS 77a, AS 77b, and AS 77c. In the absence of knife 44, AS 77c forms on surface 34 a spot 54 having a spot size 88c, which is substantially larger than the required spot size for performing the X-ray analysis described above.

In some embodiments, distance 66 defines the spot size for each angular sector of beams 13 and 23. In the present example, a spot 56, which is formed by AS 77b of beam 23, has a spot size 88b, and a spot 55, which is formed by AS 77a of beam 13, has spot size 88a, which is the required spot size for performing the aforementioned X-ray analysis. Note that the X-ray radiated from wafer 33, which is shown in the general view as XR 16, comprises XR sections 99a and 99b corresponding to ASs 77a and 77b, respectively, whose intensities are sensed by XDA 17.

In some embodiments, a surface 57 of knife 44 (having a ball shape as described above) may have an engineered surface topography having any suitable pattern, and/or having roughness (e.g., a roughness level smaller than about 1 μm, or any other suitable level of roughness) in order to minimize undesired specular reflection (or other type of reflections) of the X-ray beams from the ball-shaped knife 44 to one or both XDAs 17 and 27. Note that the roughness level is measured between the farthest points on surface 57 and the distance their between is measured along the radial axis of knife 44, which is orthogonal to surface 57. Such topography and/or roughness could be fabricated using any suitable techniques, such as but not limited to an abrasion process, a laser micro-machining process, and an etching process. Note that the level of roughness depends, inter alia, on the size of distance 66. For example, (i) in case distance 66 is larger than about 1 μm (e.g., 2 μm) than the roughness level of surface 55 may be larger than about 1 μm, and (ii) in case distance 66 is smaller than about 1 μm (e.g., 0.8 μm) than the roughness level of surface 55 may be larger than about 0.8 μm.

In other embodiments, at least a first section of surface 57 (e.g., surface 57 of the hemisphere facing spot 55, or any suitable percentage of surface 57 other than about 50%) may have the aforementioned topography and/or roughness, and a second section of surface 57 (e.g., surface 57 of the hemisphere facing arm 19, or any suitable percentage of surface 57 other than about 50%) may be smooth. Note that in the context of the present disclosure and in the claims, the term "smoothness" and grammatical variations thereof refer to a roughness level smaller than about 100 nm. In yet other embodiments, knife 44 may be smooth along the entire area of surface 57.

In some embodiments, beam shaper 15 may be positioned to block at least part of AS 77b of X-ray beam 13, so as to obtain on surface 34 spot 88a in the X-ray beam produced by XC 11.

In some examples, X-ray optics 24 are configured to focus X-ray beam 23 onto surface 34 of wafer 33, and to produce a spot, such as spot 56. In an example, the position of beam shaper 15a of XC 21 does not block AS 77b so that photons of XR section 99b are sensed by XDA 27 for estimating distance 66.

Reference is now made back to the general view of FIG. 1. In some embodiments, processor 22 is electrically connected, via cables 18, to one or more components of XC 11 (e.g., to source 12, X-ray optics 14, and XDA 17), and to motion assembly 45, as shown in FIG. 1. Similarly, processor 22 is electrically connected, via cables 18, to X-ray source 28, X-ray optics 24, beam shaper 15a and XDA 27 for exchanging signals, such as data signals and control signals. Processor 22 is configured to estimate and also to control distance 66 based on the signals received from XDA 27, as will be described in more detail below.

In some embodiments, processor 22 is configured to control the spot size on surface 34 by controlling: (i) elevation angle 38 of the incident X-ray beams of XCs 11 and 21 (e.g., beam 13 of XC 11), and (ii) motion assembly 45 for setting distance 66 between the surface of knife 44 and surface 34 of wafer 33.

In some embodiments, processor 22 is configured to receive from XCs 11 and 21, first and second signals, respectively. The first signal is indicative of properties of the structures intended to be analyzed, as described in the overview section above. In some embodiments, based on the second signal, processor 22 is configured to estimate distance 66, and therefore, to estimate the spot size (e.g., spot size 88a) formed by beam 13 of XC 11 on surface 34. Moreover, based on the second signal, processor 22 is configured to adjust the spot size by controlling motion assembly 45 (and/or other motion assemblies configured to move knife 44 relative to surface 34) to adjust the distance between knife 44 and surface 34 of wafer 33. Additional embodiments of the present disclosure that are related to XCs 11 and 21 are described in FIG. 2 below.

This particular configuration of system 10 is provided by way of example, and is simplified for the sake of conceptual clarity. In alternative embodiments, the disclosed techniques can be used, mutatis mutandis, in other types of suitable measurement and inspection systems, such as optical-based, other configurations of X-ray systems, electron-beam based systems, and ion-beam based systems. Moreover, the disclosed techniques can be used, mutatis mutandis, in analyzing any suitable substrate other than a semiconductor wafer.

In some embodiments, processor 22 comprises a general-purpose computer, which is programmed in software to carry out the functions described herein. The software may be downloaded to the computer in electronic form, over a network, for example, or it may, alternatively or additionally, be provided and/or stored on non-transitory tangible media, such as magnetic, optical, or electronic memory.

Figure 2:
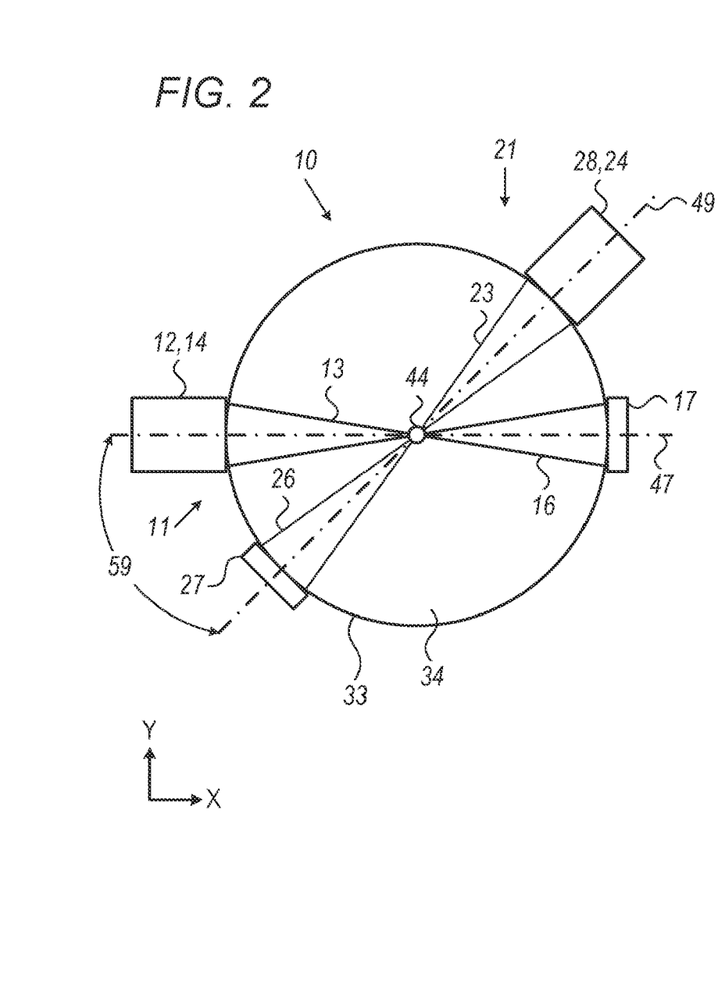
FIG. 2 is a schematic, top view of the system for X-ray measurements, in accordance with an embodiment of the present invention.

Improving Spot-Size Control in X-Ray Analysis
Carried Out Using GI-SAXS and XRR Systems FIG. 2 is a schematic, top view of X-ray system 10, in accordance with an embodiment of the present invention. In some embodiments, both XC 11 and XC 21 are positioned at the first side of wafer 33 and have a common knife 44, so that in the top view of FIG. 2, XCs 11 and 21 appear above wafer 33.

In some embodiments, XC 11 is positioned so that a projection of beam 13 and XR 16 on surface 34 of wafer 33 lies along an axis 47, also referred to herein as a first axis. Note that X-ray source 12 and X-ray optics 14 are shown together for the sake of conceptual clarity, but are different components of XC 11 as shown in FIG. 1 above. As described in FIG. 1 above, XC 21 comprises X-ray source 28 and X-ray optics 24 that are shown as a single component, but are actually different components as described for XC 11 in the sentence above.

In some embodiments, XC 21 is positioned so that the projection of beam 23 and XR 26 on surface 34 of wafer 33 lies along an axis 49, also referred to herein as a second axis.

In some embodiments, XCs 11 and 21 are positioned in system 10, such that respective axes 47 and 49 are positioned at a rotation angle 59 relative to one another. In such embodiments, beams 13 and 23 both illuminate the surface 34 between wafer 33 and knife 44, and the intensities of XRs 16 and 26 are sensed by XDAs 17 and 27, respectively. In other words, XCs 11 and 21 are applying beams 13 and 23, respectively, to the same location on surface 34, but from different directions. This configuration reduces the probability of directing the X-ray beam from the source of one XC (e.g., XC 11) and sensing the XR intended to be sensed by the XDA of the other XC (e.g., XC 21), and vice versa. Therefore, this configuration increases the SNR of the first and second signals produced by XCs 11 and 21, respectively. Note that rotation angle 59 may have any suitable size, e.g., between about 2o and 1780. Note that knife 44 has a ball shape in order to maintain a symmetric cross section in the plane parallel to surface 34 of wafer 33. The symmetric cross section is applicable for both X-ray beams 13 and 23 impinging on the spherical- or spheroidal-shaped surface of knife 44. Moreover, using spherical- or spheroidal- shaped surface of knife 44 allows using the same knife (e.g., knife 44) for both beams 13 and 23.

In some embodiments, processor 22 is configured to control XCs 11 and 21 to directs respective beams 13 and 23 at different elevation angles relative to surface 34 of wafer 33. In accordance with the example shown in inset 53 of FIG. 1 above, processor 22 is configured to control XC 11 to direct AS 77a of beam 13 to surface 34, so as to: (i) produce on surface 34 spot 55 having sufficiently small spot size 88a, (ii) sense the photons of XR section 99a by XDA 17, and (iii) produce the first signal based on the sensed radiation in XDA 17. In such embodiments, processor 22 is configured to perform analysis (e.g., produce measurement results) on the structures located in wafer 33 at the area of spot 55.

As described in FIG. 1 above, the properties of XCs 11 and 21 are similar, therefore, ASs 77a, 77b and 77c, spots 54-56 and XR sections 99a and 99b are applicable, mutatis mutandis, to beam 23 and XR 26. In some embodiments, processor 22 is configured to control XC 21 to direct AS 77b of beam 23 to surface 34, so as to: (i) produce on surface 34 spot 56 having spot size 88b, (ii) sense the photons of XR section 99b by XDA 27, and (iii) produce the second signal based on the sensed radiation in XDA 27. In such embodiments, processor 22 is configured to estimate distance 66 between surface 34 and knife 44 based on the second signal. Note that because the second signal is not used for X-ray analysis of the structures of wafer 33, the spot size is not critical and the intensity of XR section 99b, which is typically larger than that of XR section 99a, and therefore increases the estimation quality of distance 66. In other words, directing beams 13 and 23 in different elevation angles 38 provides the user of system 10 with improved performance. For example, improved conditions are obtained when directing beam 13 in a suitable elevation angle for obtaining spot size smaller than about 100 µm (for improved X-ray analysis), while having the elevation angle of beam 23 smaller than that of beam 13 (for improved sensitivity of measuring distance 66).

Figure 3:
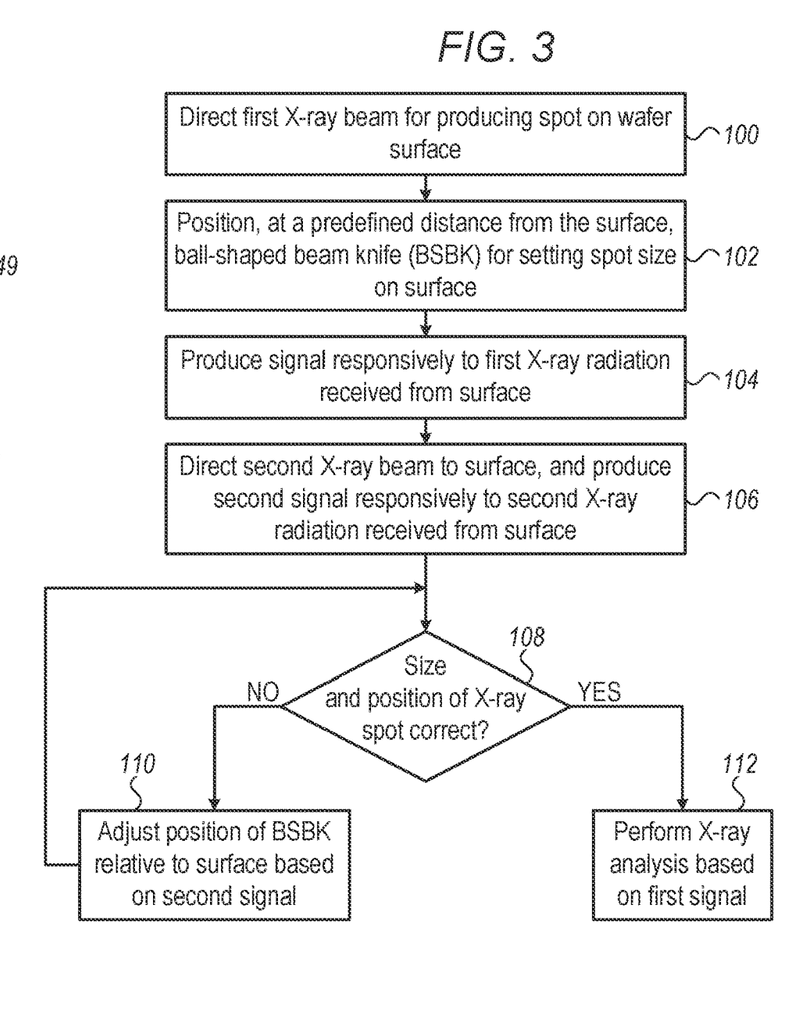
FIG. 3 is a flow chart that schematically illustrates a method for improving spot-size control and performing X-ray measurements in an X-ray system, in accordance with an embodiment of the present invention.

FIG. 3 is a flow chart that schematically illustrates a method for improving spot-size control and performing X-ray measurements in X-ray system 10, in accordance with an embodiment of the present invention.

At a first beam direction step 100, processor 22 is configured to control the XC 11 to direct beam 13 to surface 34 of wafer 33, as described in FIGS. 1 and 2 above.

At a knife positioning step 102, processor 22 controls motion assembly 45 to position knife 44, in the present example, a ball-shaped beam knife (BSBK), at distance 66 from surface 34 of wafer 33, as described in detail in FIG. 1 above. Note that positioning knife 44, sets on surface 34 spot 55 having spot size 88a, as described in detail in inset 53 of FIG. 1 above.

At a first signal production step 104, processor 22 receives from XC 11 the first signal, which is based on XR section 99a obtained responsively to positioning knife 44 and directing beam 13.

At a first signal production step 106, processor 22 controls XC 21 to: (i) direct x-ray beam 23 to surface 34, and (ii) produce the second signal responsively to XR section 99b received from surface 34.

At a decision step 108, processor 22 checks, (i) based on the second signal, whether distance 66 is within the specification (e.g., about 1 µm), which is indicative of the spot size of beam 13, and (ii) based on an optical image received from OM 20 (or based on any other suitable signal), whether X-ray spot 55 is positioned at the predefined measurement site on surface 34.

In case the position and/or the size of spot 55 is not meeting the specification, the method proceeds to a position adjustment step 110, in which processor 22 controls motion assembly 45 to adjust the position of knife 44 (e.g., BSBK) relative to surface 34 of wafer 33. Note that the position adjustment may comprise at least one of: (i) position adjustment along the Z-axis based on the second signal, as described in detail in FIG. 1 above, (ii) position adjustment within the XY plane, based on the optical image received from OM 20, and (iii) position adjustment in both XY plane and the Z-axis.

In some embodiments, after concluding step 110, the method loops back to step 108, and processor 22 checks the spot size and position of spot 55 on surface 34. In case both are in accordance with the specification, the method proceeds to an X-ray analysis step 112 that concludes the method. In step 112, processor 22 controls XCs 11 and 21 to direct respective beams 13 and 23, and to produce the first and second signals, respectively, as described in FIGS. 1 and 2 above.

In some embodiments, based on the first signal processor 22 performs the X-ray analysis, such as but not limited to measurement of dimensions (e.g., thickness of a layer, width of a line, a trench, a hole, a space between adjacent lines, and depth/height thereof) on structures produced on wafer 33, and other sorts of measurement, as described in detail in the overview section above.

The method of FIG. 3 is provided by way of example, in order to illustrate certain problems that are addressed by embodiments of the present invention and to demonstrate the application of these embodiments in enhancing the performance of such an X-ray analysis system. Embodiments of the present invention, however, are by no means limited to this specific sort of example method (of FIG. 3) and example system 10 (of FIGS. 1 and 2), and the principles described herein may similarly be applied to other methods and other sorts of X-ray analysis systems used in fabrication processes of integrated circuits and other suitable devices.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An X-ray system, comprising:
   a first X-ray channel (XC), which is configured to: (i) direct a first X-ray beam for producing a spot on a surface of a sample, and (ii) produce a first signal responsively to a first X-ray radiation received from the surface;
   a spot sizer, which is positioned at a distance from the surface and is shaped and positioned to set a size of the spot by passing to the surface a portion of the first X-ray beam;
   a second XC, which is configured to: (i) direct a second X-ray beam to the surface, and (ii) produce a second signal responsively to a second X-ray radiation received from the surface; and
   a processor, which is configured to: (i) perform an analysis of the sample based on the first signal, and (ii) estimate the size of the spot based on the second signal.

2. The X-ray system according to claim 1, and comprising a motion assembly, which is configured to adjust the distance between the spot sizer and the surface, wherein the processor is configured to adjust the spot size by controlling the motion assembly based on the second signal.

3. The X-ray system according to claim 1, and comprising a beam shaper, which is positioned along a path of at least the first X-ray beam, and is configured to pass a selected angular sector of the first X-ray beam.

4. The X-ray system according to claim 1, wherein the first X-ray beam is directed at a first angle relative to the surface, and the second X-ray beam is directed, relative to the surface, at a second angle different from the first angle.

5. The X-ray system according to claim 1, wherein the sample comprises a semiconductor wafer having the surface on a first side, and a second side, wherein the first and second XCs comprise: (i) first and second X-ray sources configured to direct the first and second X-ray beams, respectively, and (ii) first and second X-ray detectors configured to sense the first and second X-ray radiations, respectively, and wherein the first and second X-ray sources and the first and second X-ray detectors are positioned on the first side of the wafer.

6. The X-ray system according to claim 1, wherein the first and second XCs are positioned so that a projection of the first X-ray beam on the surface lies along a first axis, and a projection of the second X-ray beam on the surface lies along a second axis, different from the first axis.

7. The X-ray system according to claim 1, wherein a surface of the spot sizer has a roughness smaller than 1 μm.

8. The X-ray system according to claim 1, wherein the spot sizer has a spherical shape or a spheroidal shape.

9. The X-ray system according to claim 1, wherein the spot sizer comprises at least one of: (i) tungsten, (ii) tungsten carbide, (iii) tantalum, (iv) gold, (v) platinum, and (vi) rhenium.

10. The X-ray system according to claim 1, wherein, based on the first signal, the processor is configured to perform at least one of: (i) X-ray reflectivity (XRR), and (ii) grazing-incidence small-angle X-ray scattering (GI-SAXS), measurements on one or more structures formed on the surface.

11. A method, comprising:
    directing a first X-ray beam for producing a spot on a surface of a sample, and producing a first signal responsively to a first X-ray radiation received from the surface;
    positioning, at a distance from the surface, a spot sizer shaped and positioned for setting a size of the spot by passing to the surface a portion of the first X-ray beam;
    directing a second X-ray beam to the surface, and producing a second signal responsively to a second X-ray radiation received from the surface; and
    performing an analysis of the sample based on the first signal, and estimating the size of the spot based on the second signal.

12. The method according to claim 11, and comprising adjusting the distance between the spot sizer and the surface, and adjusting the spot size by controlling the distance based on the second signal.

13. The method according to claim 11, and comprising positioning, along a path of at least the first X-ray beam, a beam shaper for passing a selected angular sector of the first X-ray beam.

14. The method according to claim 11, wherein directing the first and second X-ray beams comprise directing the first X-ray beam at a first angle relative to the surface, and directing the second X-ray beam, relative to the surface, at a second angle different from the first angle.

15. The method according to claim 11, wherein the sample comprises a semiconductor wafer having the surface on a first side, and a second side, wherein directing the first and second X-ray beams and sensing the first and second X-ray radiations are carried out on the first side of the wafer.

16. The method according to claim 11, wherein a projection of the first X-ray beam on the surface lies along a first axis, and a projection of the second X-ray beam on the surface lies along a second axis, different from the first axis.

17. The method according to claim 11, wherein a surface of the spot sizer has a roughness smaller than 1 μm.

18. The method according to claim 11, wherein the spot sizer has a spherical or spheroidal shape.

19. The method according to claim 11, wherein the spot sizer comprises at least one of: (i) tungsten, (ii) tungsten carbide, (iii) tantalum, (iv) gold, (v) platinum, and (vi) rhenium.

20. The method according to claim 11, wherein analyzing the sample comprises performing at least one of: (i) X-ray reflectivity (XRR), and (ii) grazing-incidence small-angle X-ray scattering (GI-SAXS), measurements on one or more structures formed on the surface.

* * * * *